United States Patent
Ohira et al.

(10) Patent No.: US 8,885,685 B2
(45) Date of Patent: Nov. 11, 2014

(54) SEMICONDUCTOR LIGHT EMITTING DEVICE, SEMICONDUCTOR LIGHT EMITTING APPARATUS, AND METHOD FOR MANUFACTURING SEMICONDUCTOR LIGHT EMITTING

(75) Inventors: Kazuya Ohira, Tokyo (JP); Haruhiko Yoshida, Chiba-ken (JP); Mizunori Ezaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 155 days.

(21) Appl. No.: 13/247,072

(22) Filed: Sep. 28, 2011

(65) Prior Publication Data
US 2012/0250714 A1 Oct. 4, 2012

(30) Foreign Application Priority Data
Mar. 31, 2011 (JP) .................................. 2011-077521

(51) Int. Cl.

| | | |
|---|---|---|
| H01S 3/083 | (2006.01) | |
| H01S 5/10 | (2006.01) | |
| H01S 5/026 | (2006.01) | |
| H01S 5/22 | (2006.01) | |
| G02B 6/293 | (2006.01) | |
| H01S 5/042 | (2006.01) | |
| H01S 5/343 | (2006.01) | |
| G02B 6/12 | (2006.01) | |
| H01S 5/223 | (2006.01) | |

(52) U.S. Cl.
CPC ............. H01S 5/1071 (2013.01); H01S 5/1032 (2013.01); H01S 5/2215 (2013.01); H01S 5/026 (2013.01); G02B 6/29338 (2013.01); H01S 5/0425 (2013.01); H01S 5/34313 (2013.01); *G02B 2006/12097* (2013.01); *H01S 5/223* (2013.01); *H01S 2301/176* (2013.01)
USPC .......................................................... 372/94

(58) Field of Classification Search
CPC .. H01S 5/1071; H01S 5/1075; G02B 6/29338
USPC .......................................................... 372/94
See application file for complete search history.

(56) References Cited

U.S. PATENT DOCUMENTS

| | | | |
|---|---|---|---|
| 5,327,448 A | 7/1994 | Holonyak, Jr. et al. | |
| 5,825,799 A * | 10/1998 | Ho et al. | 372/92 |
| 5,878,070 A * | 3/1999 | Ho et al. | 372/92 |

FOREIGN PATENT DOCUMENTS

| | | |
|---|---|---|
| JP | 1-134430 A | 5/1989 |
| JP | 4-326333 A | 11/1992 |

(Continued)

OTHER PUBLICATIONS

Wipiejewski et al., "Integration of Active Optical Components," Jan. 2003, Proc. SPIE, vol. 4997A-02.*

(Continued)

*Primary Examiner* — Julio J Maldonado
*Assistant Examiner* — Joshua King
(74) *Attorney, Agent, or Firm* — Oblon, Spivak, McClelland, Maier & Neustadt, L.L.P.

(57) ABSTRACT

According to one embodiment, a semiconductor light emitting device includes a first semiconductor layer and a laser resonator. The first semiconductor layer includes a first portion and a second portion juxtaposed with the first portion. The laser resonator is provided on the first portion and has a ring-shaped resonator structure circled along a major surface of the first semiconductor layer. The second portion guides light emitted from the laser resonator.

12 Claims, 11 Drawing Sheets

(56) References Cited

FOREIGN PATENT DOCUMENTS

| JP | 11-507471 | 6/1999 |
|---|---|---|
| JP | 2002-33550 | 1/2002 |
| JP | 2002-217484 A | 8/2002 |
| JP | 2009-76498 | 4/2009 |

OTHER PUBLICATIONS

Machine translation of JP 2001-010766 Shimoyama Aug. 2, 2002.*
Machine translation of JP 2002-033550 Onouchi Jan. 31, 2002.*

Office Action issued Jul. 10, 2013 in Japanese Patent Application No. 2011-077521 (with English-language translation).
U.S. Appl. No. 13/050,416, filed Mar. 17, 2011, Kazuya Ohira, et al.
J. P. Zhang, et al., "Directional Light Output from Photonic-Wire Microcavity Semiconductor Lasers," IEEE Photonics Technology Letters, vol. 8, No. 8, Aug. 1996, pp. 968-970.
Japanese Office Action issued Apr. 1, 2013, in Patent Application No. 2011-077521 (with English-language translation).
U.S. Appl. No. 13/677,951, filed Nov. 15, 2012, Ohira, et al.
Office Action issued Dec. 25, 2013 in Japanese Patent Application No. 2011-077521 (with English language translation).

* cited by examiner

SEMICONDUCTOR LIGHT EMITTING DEVICE, SEMICONDUCTOR LIGHT EMITTING APPARATUS, AND METHOD FOR MANUFACTURING SEMICONDUCTOR LIGHT EMITTING

CROSS-REFERENCE TO RELATED APPLICATIONS

This application is based upon and claims the benefit of priority from the prior Japanese Patent Application No. 2011-077521, filed on Mar. 31, 2011; the entire contents of which are incorporated herein by reference.

FIELD

Embodiments described herein relate generally to a semiconductor light emitting device, a semiconductor light emitting apparatus, and a method for manufacturing the semiconductor light emitting device.

BACKGROUND

With the increase in the packing density of LSI (large scale integration) and other circuits, pattern miniaturization of internal circuits is advanced. This leads to the increase of interconnect resistance due to the decrease in interconnect cross-sectional area. Furthermore, the spacing between adjacent interconnects is narrowed, and hence the capacitance between interconnects is increased. This increases the interconnect delay time determined by the interconnect resistance and the interconnect capacitance.

As a technology for solving the problem of interconnect delay associated with the increased density of LSI and other circuits, optical interconnect technology for replacing electrical signals by optical signals is drawing attention. Optical interconnect technology is a technique for signal transmission using optical waveguides instead of metal interconnects. Signal transmission using optical waveguides does not involve the aforementioned increase in the interconnect resistance and the capacitance between interconnects associated with miniaturization. Thus, further acceleration of operating speed is expected. In such optical interconnect technology, further improvement in the transmission efficiency of optical signals is required.

DETAILED DESCRIPTION

Figure 1:
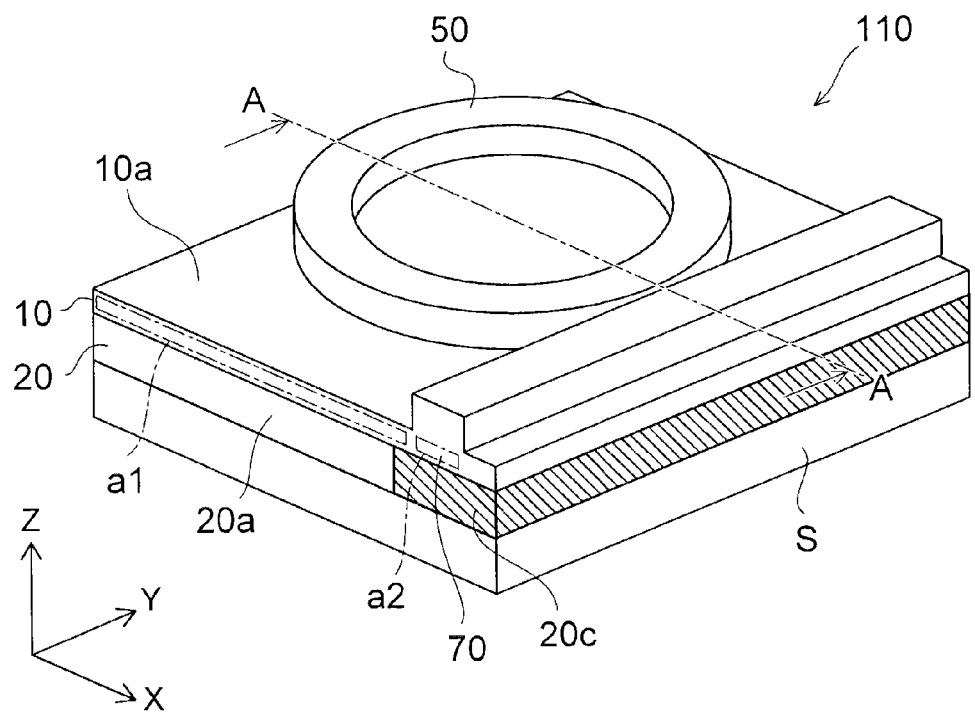
FIG. 1 is a schematic perspective view of a semiconductor light emitting device according to an embodiment.

In general, according to one embodiment, a semiconductor light emitting device includes a first semiconductor layer and a laser resonator. The first semiconductor layer includes a first portion and a second portion juxtaposed with the first portion. The laser resonator is provided on the first portion and has a ring-shaped resonator structure circled along a major surface of the first semiconductor layer. The second portion guides light emitted from the laser resonator.

In general, according to another embodiment, a semiconductor light emitting apparatus includes an integrated circuit, a semiconductor light emitting device and an optical fiber. The integrated circuit is formed on a semiconductor substrate. The semiconductor light emitting device is provided on the semiconductor substrate and includes a semiconductor layer including a first portion and a second portion juxtaposed with the first portion, and a laser resonator provided on the first portion and having a ring-shaped resonator structure circled along a major surface of the semiconductor layer. Light emitted from the laser resonator by an electrical signal outputted from the integrated circuit is guided by the second portion. The optical fiber is configured to transmit the light guided by the second portion.

In general, according to another embodiment, a method is disclosed for manufacturing a semiconductor light emitting device. The method can include forming a stacked structure including a first cladding layer, an active layer, and a second cladding layer on a major surface of a semiconductor layer. In addition, the method can include removing a part of the stacked structure to form a laser resonator having a ring-shaped resonator structure circled along the major surface of the semiconductor layer, and removing another part of the stacked structure to form an optical waveguide configured to guide light emitted from the laser resonator along the major surface.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted as appropriate.

In the following description, by way of example, it is assumed that the first conductivity type is n-type and the second conductivity type is p-type.

First Embodiment

FIG. 1 is a schematic perspective view illustrating the configuration of a semiconductor light emitting device according to a first embodiment.

Figure 2:
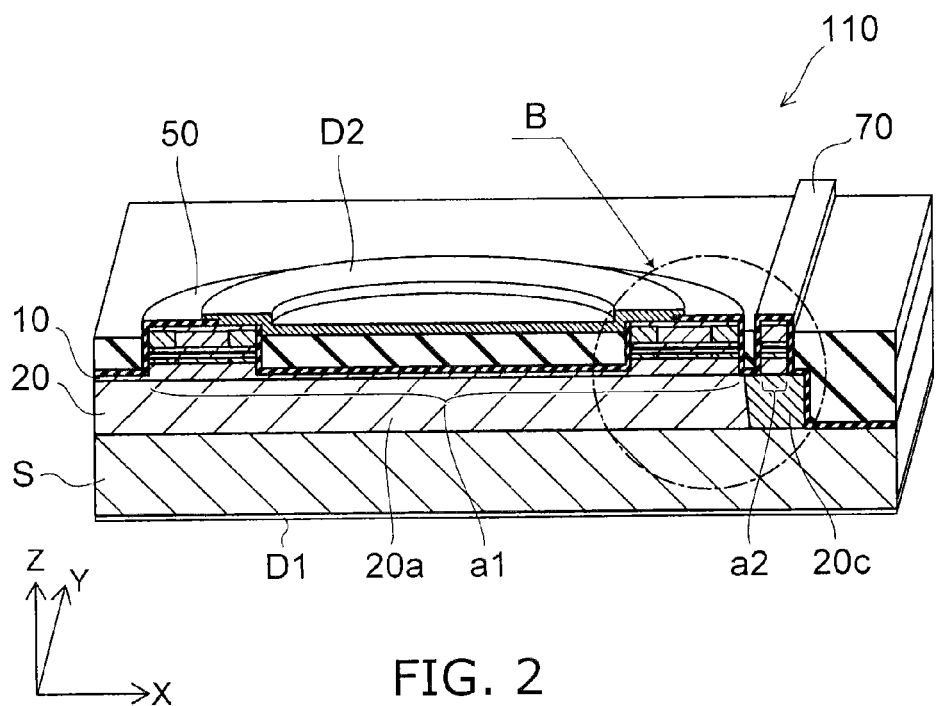
FIG. 2 is a partial sectional schematic perspective view of the semiconductor light emitting device according to the embodiment.

FIG. 2 is a partial sectional schematic view of the semiconductor light emitting device according to the first embodiment.

The cross section shown in FIG. 2 shows the A-A cross section of FIG. 1.

The semiconductor light emitting device 110 according to the first embodiment includes a first semiconductor layer 10 and a laser resonator 50.

In the embodiments, the direction orthogonal to the major surface 10a of the first semiconductor layer 10 is referred to as Z-axis direction, and the directions orthogonal to the Z-axis direction are referred to as X-axis direction and Y-axis direction. The major surface 10a of the first semiconductor layer 10 lies on the X-Y plane orthogonal to the Z-axis direction. The major surface 10a side of the first semiconductor layer 10 is also referred to as "above" (upper side), and the opposite side is also referred to as "below" (lower side).

In the semiconductor light emitting device 110, the first semiconductor layer 10 includes a first portion a1 and a second portion a2 juxtaposed with the first portion. The first portion a1 and the second portion a2 are juxtaposed along the major surface 10a. The first semiconductor layer 10 is made of e.g. compound semiconductor, and its conductivity type is e.g. the first conductivity type.

The laser resonator 50 is provided on the first portion a1. The laser resonator 50 has a ring-shaped resonator structure circled along the major surface 10a of the first semiconductor layer 10. A second electrode D2 is provided above the laser resonator 50.

In the semiconductor light emitting device 110 of the embodiment, light emitted from the laser resonator 50 is guided in the second portion a2. That is, the second portion a2 functions as an optical waveguide 70.

In the semiconductor light emitting device 110, a second semiconductor layer 20a is in contact with the lower surface of the first portion a1 of the first semiconductor layer 10. Furthermore, a low refractive index layer 20c is in contact with the lower surface of the second portion a2. The second semiconductor layer 20a is made of e.g. compound semiconductor, and its conductivity type is e.g. the first conductivity type. The second semiconductor layer 20a and the low refractive index layer 20c function as a lower cladding layer 20.

The lower cladding layer 20 is formed on e.g. a substrate S. A first electrode D1 is formed below the substrate S. Here, the first electrode D1 only needs to be in electrical continuity with the second semiconductor layer 20a. Hence, the first electrode D1 does not necessarily need to be provided below the substrate S.

The optical waveguide 70 is provided along the major surface 10a and guides the light emitted from the laser resonator 50 along the major surface 10a. That is, the laser resonator 50 and the optical waveguide 70 are in the coupled state (optically coupled state) capable of propagating optical signals from the laser resonator 50 to the optical waveguide 70. The laser resonator 50 and the optical waveguide 70 are made of e.g. compound semiconductor.

In the case where the first semiconductor layer 10, the second semiconductor layer 20a, the laser resonator 50, and the optical waveguide 70 are made of compound semiconductor, the compound semiconductor is e.g. a material including gallium arsenide (GaAs), a material including gallium phosphide (GaP), or a material including gallium nitride (GaN).

In the semiconductor light emitting device 110 according to the embodiment, at least part of the layer structure of the laser resonator 50 is equal to the layer structure of the optical waveguide 70. More specifically, the layer structure of the laser resonator 50 and the layer structure of the optical waveguide 70 are formed by etching a uniformly formed layer structure. Thus, the spacing d between the laser resonator 50 and the optical waveguide 70 is set with accuracy nearly equal to the accuracy in etching the layer structure. Here, the spacing d is the spacing at the position where the ring-shaped laser resonator 50 comes closest to the optical waveguide 70 having e.g. a linear shape.

Next, a specific stacked structure is described.

Figure 3:
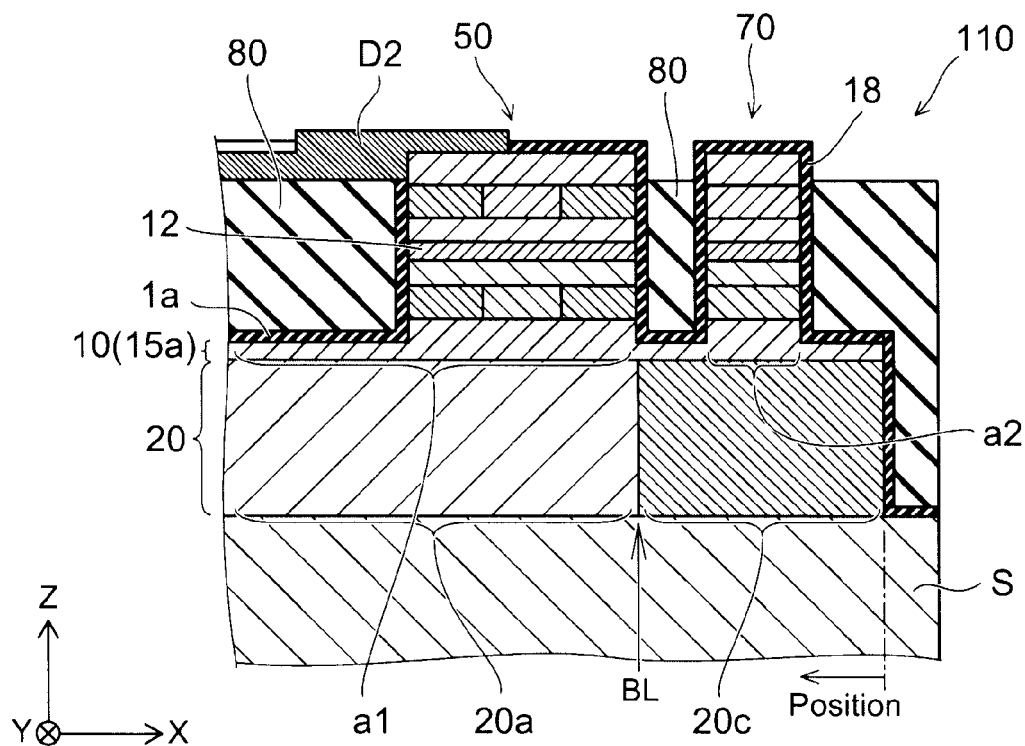
FIG. 3 and FIG. 4 are schematic sectional views of the semiconductor light emitting device according to the embodiment.

FIG. 3 is a schematic sectional view enlarging part of the semiconductor light emitting device.

In FIG. 3, the portion B shown in FIG. 2 is shown in an enlarged view.

Figure 4:
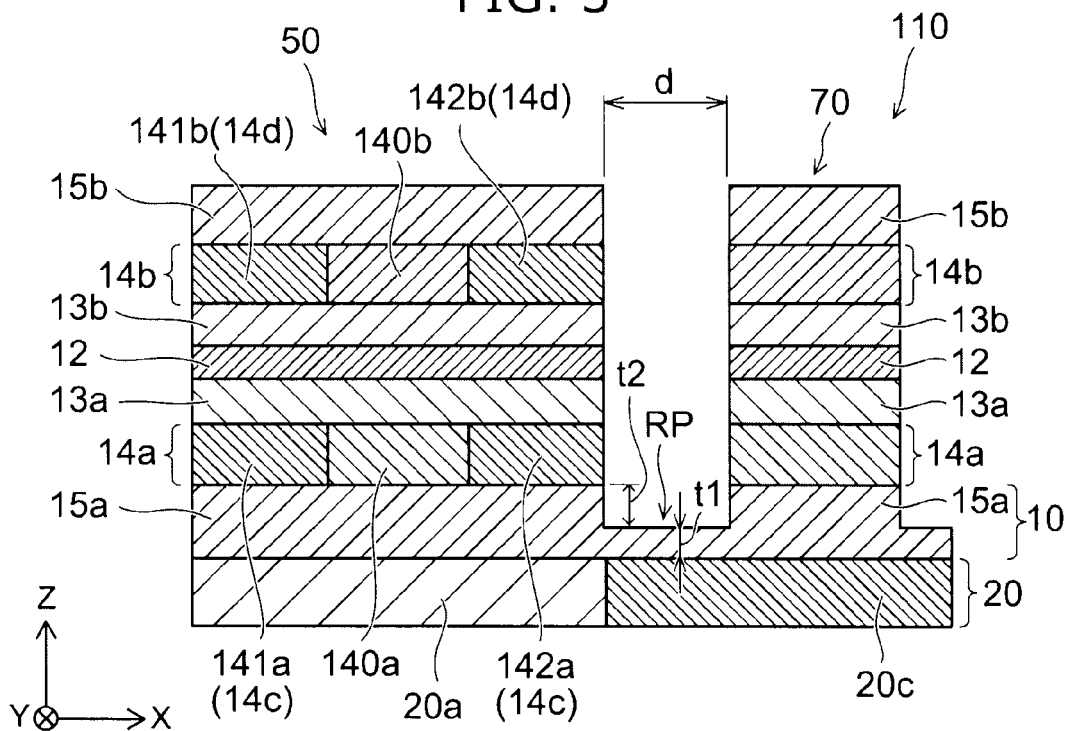

FIG. 4 is a schematic sectional view of the laser resonator and the optical waveguide.

In FIG. 4, a cross section of the laser resonator and the optical waveguide shown in FIG. 3 is schematically shown.

As shown in FIGS. 3 and 4, the laser resonator 50 includes a stacked structure (first stacked structure) including a first cladding layer 14a, an active layer 12, and a second cladding layer 14b.

Specifically, the laser resonator 50 includes an active layer 12, a first optical confinement layer 13a, a second optical confinement layer 13b, a first cladding layer 14a, and a second cladding layer 14b. The first optical confinement layer 13a of the first conductivity type is formed below the active layer 12. The second optical confinement layer 13b of the second conductivity type is formed above the active layer 12. The first cladding layer 14a of the first conductivity type is formed below the first optical confinement layer 13a. The second cladding layer 14b of the second conductivity type is formed above the second optical confinement layer 13b.

A first contact layer 15a of the first conductivity type is formed between the second semiconductor layer 20a and the first cladding layer 14a. In the semiconductor light emitting device 110, the first contact layer 15a is the first semiconductor layer 10.

A second contact layer 15b of the second conductivity type is formed between the second cladding layer 14b and the second electrode D2.

The first contact layer 15a is formed like a flat plate. The active layer 12, the first optical confinement layer 13a, the second optical confinement layer 13b, the first cladding layer 14a, the second cladding layer 14b, and the second contact layer 15b are formed in a ring shape.

On the first contact layer 15a shaped like a flat plate, the first cladding layer 14a, the first optical confinement layer 13a, the active layer 12, the second optical confinement layer 13b, the second cladding layer 14b, and the second contact layer 15b in a ring shape are formed in this order. Hence, the first contact layer 15a extends to the inside and outside of the ring.

The first cladding layer 14a includes a first inner peripheral portion 141a extending from the inner edge to part of the interior of the ring, a first outer peripheral portion 142a extending from the outer edge to part of the interior of the ring, and a first central portion 140a between the first inner peripheral portion 141a and the first outer peripheral portion 142a. The first inner peripheral portion 141a and the first outer peripheral portion 142a are modified into first modified layers 14c having a lower refractive index than the first central portion 140a by thermal oxidation. Hence, in the first cladding layer 14a, the first central portion 140a sandwiched between the modified layers 14c of the first inner peripheral portion 141a and the first outer peripheral portion 142a functions as a first cladding layer as intended.

Likewise, the second cladding layer 14b includes a second inner peripheral portion 141b extending from the inner edge to part of the interior of the ring, a second outer peripheral portion 142b extending from the outer edge to part of the interior of the ring, and a second central portion 140b between the second inner peripheral portion 141b and the second outer peripheral portion 142b. The second inner peripheral portion 141b and the second outer peripheral portion 142b are modified into second modified layers 14d having a lower refractive index than the second central portion 140b by thermal oxidation. Hence, in the second cladding layer 14b, the second central portion 140b sandwiched between the modified layers 14d of the second inner peripheral portion 141b and the second outer peripheral portion 142b functions as a second cladding layer as intended.

The surface of the ring-shaped laser resonator 50 and the surface of the optical waveguide 70 are covered with an insulating film 18. An insulating film 80 is buried inside the ring of the laser resonator 50 and between the laser resonator 50 and the optical waveguide 70.

Part of the upper surface of the second contact layer 15b is exposed. The second electrode D2 is provided on this exposed portion. The second electrode D2 is formed in a disk shape. Part of the second electrode D2 is formed on the insulating film 80. Another part of the second electrode D2 is formed on the exposed portion of the second contact layer 15b.

The active layer 12 includes e.g. an undoped multiple quantum well layer. In the structure of the undoped multiple quantum well layer, e.g. three InGaAs quantum well layers having a thickness of 8 nanometers (nm) and e.g. three GaAs barrier layers having a thickness of e.g. 10 nm are alternately stacked. On both sides thereof, the stacked layers are sandwiched between e.g. $Al_{0.1}Ga_{0.9}As$ layers having a thickness of 40 nm.

The first optical confinement layer 13a is e.g. an n-type GaAs layer having a thickness of 100 nm. The second optical confinement layer 13b is e.g. a p-type GaAs layer having a thickness of 100 nm. The first cladding layer 14a is e.g. an n-type $Al_{0.92}Ga_{0.08}As$ layer having a thickness of 300 nm. The second cladding layer 14b is e.g. a p-type $Al_{0.92}Ga_{0.08}As$ layer having a thickness of 300 nm. The first contact layer 15a is e.g. an n-type GaAs layer having a thickness of 10 nm. The second contact layer 15b is e.g. a p-type GaAs layer having a thickness of 10 nm.

The first modified layer 14c and the second modified layer 14d are layers obtained by thermally oxidizing the first cladding layer 14a and the second cladding layer 14b. The first modified layer 14c and the second modified layer 14d have a lower refractive index than the first cladding layer 14a and the second cladding layer 14b. The first modified layer 14c and the second modified layer 14d have electrical insulation property.

The substrate S is made of e.g. n-type GaAs. The second semiconductor layer 20a is made of e.g. n-type $Al_{0.96}Ga_{0.04}As$.

The first electrode D1 is made of e.g. gold-germanium (AuGe) alloy. The first electrode D1 is e.g. a cathode electrode. The second electrode D2 is made of e.g. gold-zinc (AuZn) alloy. The second electrode D2 is e.g. an anode electrode. The insulating film 18 is made of e.g. $SiO_2$. The insulating film 80 is made of e.g. polyimide.

The laser resonator 50 is an optical resonator circled along the ring-shaped outer periphery. The laser resonator 50 is optically coupled to the optical waveguide 70, which is the second portion a2 of the first semiconductor layer 10. The outer diameter of the ring of the laser resonator 50 is e.g. 10 micrometers (μm). The inner diameter of the ring is e.g. 5 μm. The thickness of the laser resonator 50 is e.g. 1 μm.

The lasing operation in the laser resonator 50 is as follows.

The second electrode D2 is connected to the positive electrode of a power supply (not shown). The first electrode D1 is connected to the negative electrode of the power supply. Thus, the laser resonator 50 is energized, and carriers are injected into the active layer 12. Then, recombination of the injected carriers results in stimulated emission. Light generated by stimulated emission alternately repeats total reflection between the inner peripheral interface and the outer peripheral interface of the first cladding layer 14a and the second cladding layer 14b, and the first modified layer 14c and the second modified layer 14d. Thus, the light circulates in the ring-shaped laser resonator 50 and causes lasing.

Here, in the case where the ring-shaped laser resonator 50 is formed by the RIE (reactive ion etching) method, the sidewall of the laser resonator 50 is roughened with a roughness of e.g. approximately 10 nm. Furthermore, ion bombardment causes damage such as microcracks and crystal defects.

On the other hand, the first modified layer 14c and the second modified layer 14d are formed by thermally oxidizing the outer peripheral sidewall and inner peripheral sidewall of the first cladding layer 14a and the second cladding layer 14b. This can sufficiently reduce the roughness and damage of the interface between the first cladding layer 14a and the second cladding layer 14b, and the first modified layer 14c and the second modified layer 14d. Thus, sufficient lasing characteristics are achieved.

Furthermore, the laser resonator 50 realizes a current narrowing structure by the first modified layer 14c and the second modified layer 14d having electrical insulation property. By this current narrowing structure, the current is selectively injected into the active layer portion in which circular modes occur. Then, the current injection portion is matched with the light intensity distribution. This increases the gain for circular modes produced in the resonator. Thus, more favorable lasing characteristics are achieved.

Furthermore, the current injected into the laser resonator 50 does not flow near the outer peripheral sidewall and inner peripheral sidewall of the ring. This can avoid carrier loss due to the influence of damage to the outer peripheral sidewall and inner peripheral sidewall, such as nonradiative recombination by nonradiative centers and surface recombination due to damage. As a result, the injection current can be used effectively.

Furthermore, the second electrode D2 is formed at a position shifted inward from the center of the second cladding layer 14b. This can reduce optical absorption loss due to the second electrode D2.

The optical waveguide 70 is optically coupled to the laser resonator 50. As described above, the optical waveguide 70 guides the light lased and emitted by the laser resonator 50 along the major surface 10a.

As shown in FIGS. 3 and 4, the optical waveguide 70 of the semiconductor light emitting device 110 includes a stacked structure (second stacked structure) including the first cladding layer 14a, the active layer 12, and the second cladding layer 14b. That is, the optical waveguide 70 includes the same stacked structure as the laser resonator 50.

The optical waveguide 70 is formed on part (second portion a2) of the first contact layer 15a. The optical waveguide 70 extends e.g. linearly along the major surface 10a. In the optical waveguide 70, the second portion a2 of the first contact layer 15a serves as a core, and the first cladding layer 14a on the second portion a2 serves as a cladding, thereby constituting an optical waveguide structure. This enables light to be guided in the extending direction of the optical waveguide 70.

The lower cladding layer 20 includes a low refractive index layer 20c including a portion overlapping the second portion a2, and a second semiconductor layer 20a including a portion overlapping the first portional, as viewed in the Z-axis direction. The refractive index of the low refractive index layer 20c is lower than the refractive index of the second portion a2. Here, the refractive index is a refractive index for the light emitted from the laser resonator 50.

The conductivity of the low refractive index layer 20c is lower than the conductivity of the second semiconductor layer 20a. The low refractive index layer 20c is e.g. a modified layer formed by thermally oxidizing part of the same material as that of the second semiconductor layer 20a (the material of the lower cladding layer 20). That is, part of the semiconductor material used to form the second semiconductor layer 20a is modified by thermal oxidation to form the low refractive index layer 20c. Here, the low refractive index layer 20c is not limited to that formed by thermally oxidizing the same material as that of the second semiconductor layer 20a. For instance, the low refractive index layer 20c may be formed by stacking a layer different from the second semiconductor layer 20a on the substrate S.

The low refractive index layer 20c thus provided can prevent the light directed from the laser resonator 50 to the optical waveguide 70 from leaking to the second semiconductor layer 20a side.

More specifically, in the optical waveguide 70, the second portion a2 of the first contact layer 15a serves as a core, and the first cladding layer 14a thereabove and the low refractive index layer 20c therebelow serves as claddings, thereby constituting an optical waveguide structure. Hence, the light emitted from the laser resonator 50 is confined in the second portion a2 of the first contact layer 15a. Thus, the light alternately repeats total reflection between the first cladding layer 14a and the low refractive index layer 20c and travels efficiently.

Here, by accurately setting the spacing d between the laser resonator 50 and the optical waveguide 70, sufficient optical coupling between the laser resonator 50 and the optical waveguide 70 can be achieved. The spacing d is set to e.g. 25 nm or more and 500 nm or less, preferably 50 nm or more and 400 nm or less, and more preferably 200 nm or more and 300 nm or less.

In the first contact layer 15a, a recessed portion RP is provided as necessary between the first portional underlying the laser resonator 50 and the second portion a2 constituting the optical waveguide 70. The thickness t1 along the Z-axis direction of the recessed portion RP is thinner than the thickness t2 along the Z-axis direction of the first portional and the second portion a2. This thickness t1 of the recessed portion RP can be used to adjust the optical power transmitted from the laser resonator 50 to the optical waveguide 70. The thickness t1 of the recessed portion RP is set to e.g. 0 nm (no recessed portion RP) or more and 250 nm or less, preferably 50 nm or more and 150 nm or less, and more preferably 75 nm or more and 100 nm or less.

The light emitted from the laser resonator 50 is transmitted from the first portional of the first contact layer 15a through the recessed portion RP to the second portion a2, and travels along the optical waveguide 70 with the second portion a2 serving as a core. Hence, preferably, the boundary location BL between the low refractive index layer 20c and the second semiconductor layer 20a is located immediately below the ring outer periphery position of the laser resonator 50, or at a position shifted therefrom to the inside of the ring.

Figure 5:
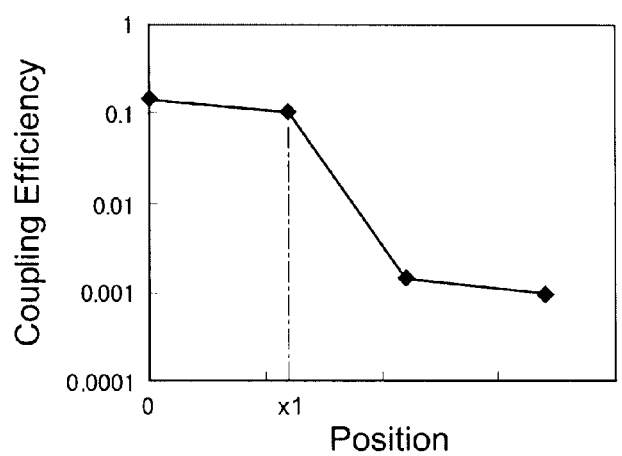
FIG. 5 illustrates the coupling efficiency.

FIG. 5 illustrates the relationship between the boundary location BL and the optical coupling efficiency.

In FIG. 5, the horizontal axis represents the boundary location BL, in terms of the position in the X-axis direction with reference to the end portion of the low refractive index layer 20c (see FIG. 3). The boundary location BL being zero represents the case where the lower cladding layer 20 is not modified. The optical coupling efficiency on the vertical axis represents the optical coupling efficiency between the low refractive index layer 20c and the second semiconductor layer 20a.

As shown in FIG. 5, if the boundary location BL exceeds x1, the coupling efficiency sharply decreases. This x1 corresponds to the position immediately below the ring outer periphery position of the laser resonator 50. Hence, by setting the boundary location BL at the position immediately below the ring outer periphery position of the laser resonator 50, or at a position shifted therefrom to the inside of the ring, the optical coupling efficiency between the low refractive index layer 20c and the second semiconductor layer 20a can be decreased. This can suppress leakage of the light emitted from the laser resonator 50 to the second semiconductor layer 20a side. Thus, the light emitted from the laser resonator 50 is efficiently transmitted to the second portion a2 without leaking from the recessed portion RP to the second semiconductor layer 20a side.

In the semiconductor light emitting device 110 according to the embodiment, the spacing d between the laser resonator 50 and the optical waveguide 70 can be set accurately. Hence, as compared with the case where the laser resonator 50 and the optical waveguide 70 are separately formed and bonded together, the optical transmission efficiency from the laser resonator 50 to the optical waveguide 70 can be increased. Furthermore, the low refractive index layer 20c provided in the lower cladding layer 20 can prevent the light emitted from the laser resonator 50 from leaking to the second semiconductor layer 20a side. Thus, the light can be efficiently guided to the optical waveguide 70.

Second Embodiment

The second embodiment relates to a method for manufacturing the semiconductor light emitting device 110.

FIGS. 6A to 7B are schematic sectional views describing the method for manufacturing a semiconductor light emitting device.

Figure 6A:
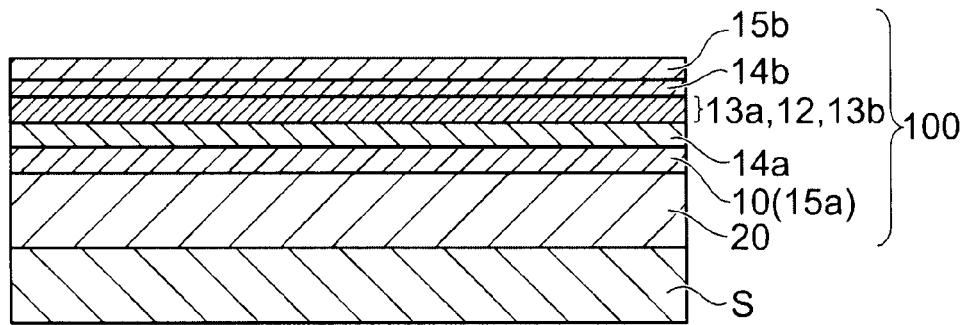
FIGS. 6A to 7B are schematic sectional views describing a method for manufacturing a semiconductor light emitting device.

First, as shown in FIG. 6A, a stacked structure 100 is formed on a substrate S. In the stacked structure 100, for instance, a lower cladding layer 20, a first contact layer 15a (first semiconductor layer 10), a first cladding layer 14a, a first optical confinement layer 13a, an active layer 12, a second optical confinement layer 13b, a second cladding layer 14b, and a second contact layer 15b are stacked.

The stacked structure 100 is formed by e.g. continuous film formation based on the MOCVD (metal organic chemical vapor deposition) method.

Here, the substrate S is made of e.g. GaAs. The lower cladding layer 20 is made of e.g. n-type $Al_{0.96}Ga_{0.04}As$ with a thickness of 1 μm. The first contact layer 15a is made of e.g. n-type GaAs with a thickness of 0.25 μm. The first cladding layer 14a is made of e.g. n-type $Al_{0.92}Ga_{0.08}As$ with a thickness of 0.1 μm. The first optical confinement layer 13a is made of e.g. n-type GaAs with a thickness of 0.01 μm.

The active layer 12 has a multiple quantum well layer structure in which e.g. three n-type GaAs quantum well layers having a thickness of 8 nm and three GaAs barrier layers having a thickness of 10 nm are alternately stacked and vertically sandwiched between $Al_{0.1}Ga_{0.9}As$ layers having a thickness of 40 nm.

The second optical confinement layer 13b is made of e.g. p-type GaAs with a thickness of 0.01 μm. The second cladding layer 14b is made of e.g. p-type $Al_{0.92}Ga_{0.08}As$ with a thickness of 0.1 μm. The second contact layer 15b is made of e.g. p-type GaAs with a thickness of 0.01 μm.

An AlGaAs graded layer may be interposed between the first contact layer 15a and the first cladding layer 14a, between the first cladding layer 14a and the active layer 12, between the active layer 12 and the second cladding layer 14b, and between the second cladding layer 14b and the second contact layer 15b. The AlGaAs graded layer gradually changes the Al composition from 0.1 to 0.92.

Figure 6B:
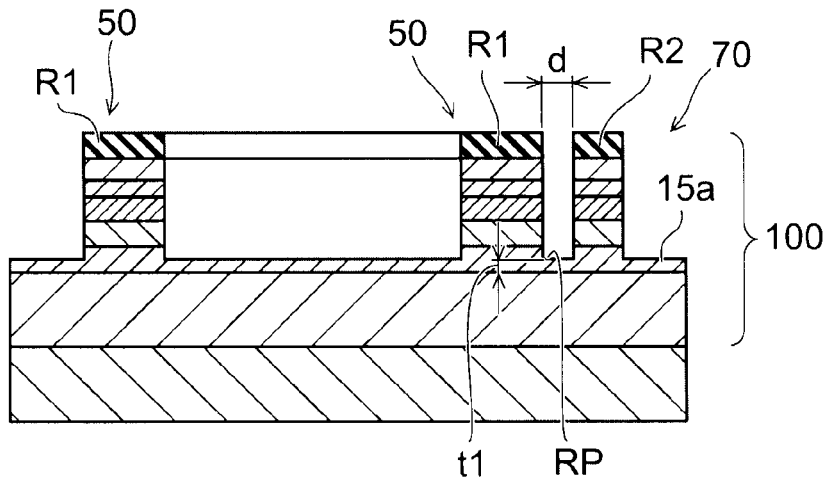

Next, as shown in FIG. 6B, on the stacked structure 100, a first resist film R1 corresponding to the ring shape of the laser resonator 50 and a second resist film R2 corresponding to the shape of the optical waveguide 70 are formed. These first resist film R1 and second resist film R2 are used as a mask to etch the stacked structure 100.

The first resist film R1 has e.g. a ring shape having an outer diameter of 10 μm and an inner diameter of 5 μm. The second resist film R2 has e.g. a linear shape having a width of 1 μm or more and 2 μm or less. The etching is based on e.g. the RIE method. This etching removes the portion of the stacked structure 100 not covered with the first resist film R1 and the second resist film R2 until the portion from the second contact layer 15b to the first contact layer 15a are exposed.

By this etching, a ring-shaped laser resonator 50 and a linear optical waveguide 70 are formed. That is, the laser resonator 50 and the optical waveguide 70 are simultaneously formed in a single etching step.

The spacing d between the laser resonator 50 and the optical waveguide 70 is accurately set by the accuracy of photolithography for forming the first resist film R1 and the second resist film R2 and the accuracy of etching such as RIE. Furthermore, the thickness t1 of the first contact layer 15a in the recessed portion RP between the laser resonator 50 and the optical waveguide 70 is accurately set by the etching such as RIE.

Figure 6C:
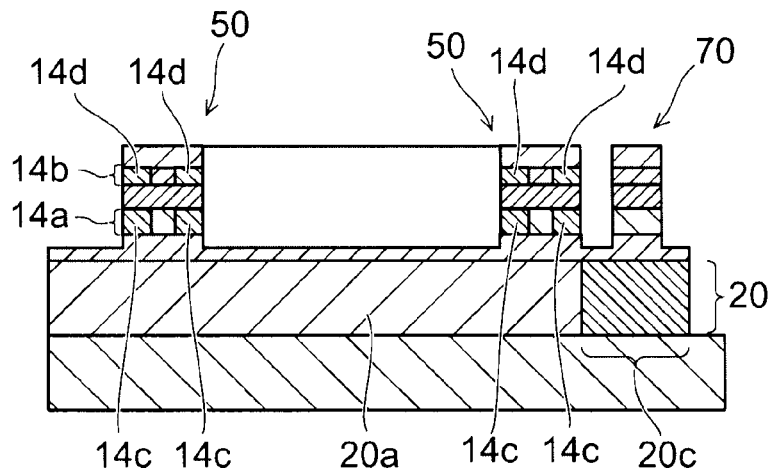

Next, as shown in FIG. 6C, oxidation treatment is performed. Before performing oxidation treatment, part of the lower cladding layer 20 outside the optical waveguide 70 is removed. The oxidation treatment is performed e.g. at a temperature of 400° C. or more and 500° C. or less in a water vapor atmosphere, an oxygen atmosphere, or ambient air. Here, the oxidation rate is determined by the Al composition ratio. That is, oxidation proceeds inward from the outer peripheral side and inner peripheral side of the first cladding layer 14a and the second cladding layer 14b having high Al composition ratio. Thus, a first modified layer 14c and a second modified layer 14d are formed. Simultaneously with this oxidation, a current narrowing structure is formed. Furthermore, by this oxidation, a low refractive index layer 20c is formed in the end portion of the lower cladding layer 20.

Typically, the oxidation rate varies with the plane orientation of the crystal. The oxidation rate is slowest for the (100) plane, and increases in the order of the (110) plane and the (111) plane.

As a result, on the outer peripheral side and inner peripheral side of the first cladding layer 14a and the second cladding layer 14b in a ring shape, the width of the modified layer slightly varies with the plane orientation. The influence becomes greater as the diameter becomes smaller. Hence, it is preferable to appropriately determine the outline of the ring shape of the laser resonator 50 before modification so that the intended circular shape is obtained after the modification.

Figure 7A:
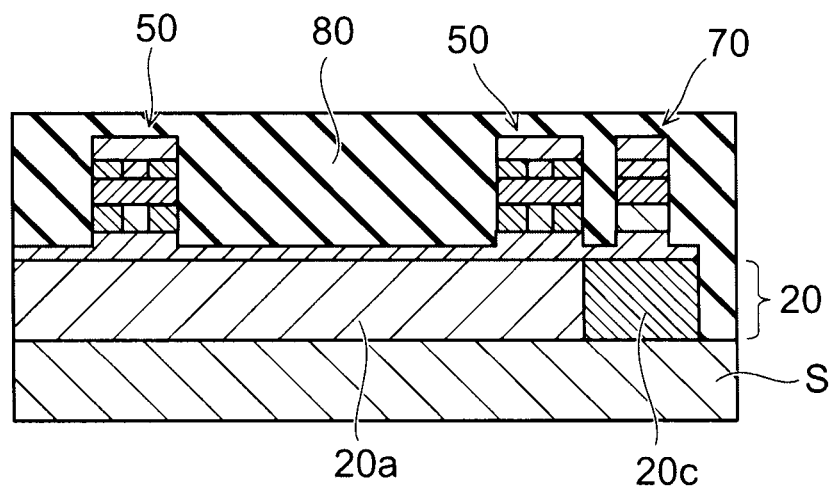

Next, as shown in FIG. 7A, an insulating film 80 burying the laser resonator 50 and the optical waveguide 70 is formed. The insulating film 80 is made of e.g. polyimide. Here, before forming the insulating film 80, the surface of the laser resonator 50 and the surface of the optical waveguide 70 may be covered with an insulating film 18.

Figure 7B:
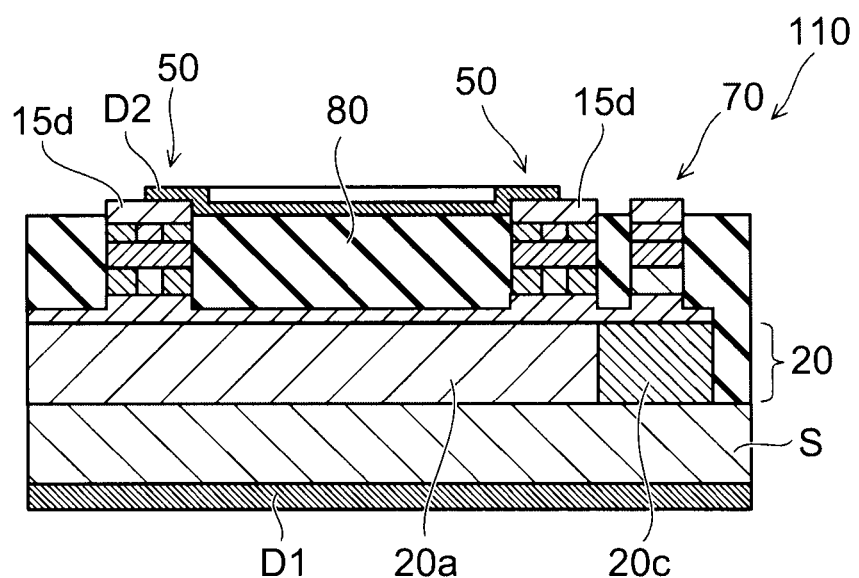

Next, as shown in FIG. 7B, the insulating film 80 is removed by e.g. the CMP (chemical mechanical polishing) method until the second contact layer 15b is exposed. Then, a second electrode D2 is formed on the inner peripheral portion of the upper surface of the exposed second contact layer 15b and on the insulating film 80 filling the inside of the laser resonator 50. Furthermore, a first electrode D1 is formed on the back surface of the substrate S.

Thus, the semiconductor light emitting device 110 is completed.

The manufacturing method as described above can manufacture the semiconductor light emitting device 110 in which the laser resonator 50 and the optical waveguide 70 are integrally formed on the lower cladding layer 20. Furthermore, the spacing d between the laser resonator 50 and the optical waveguide 70 can be accurately set with the etching accuracy. As compared with the case where the laser resonator 50 and the optical waveguide 70 are separately formed and bonded together, it is possible to easily manufacture a semiconductor light emitting device 110 in which the optical transmission efficiency from the laser resonator 50 to the optical waveguide 70 can be increased.

Third Embodiment

Figure 8:
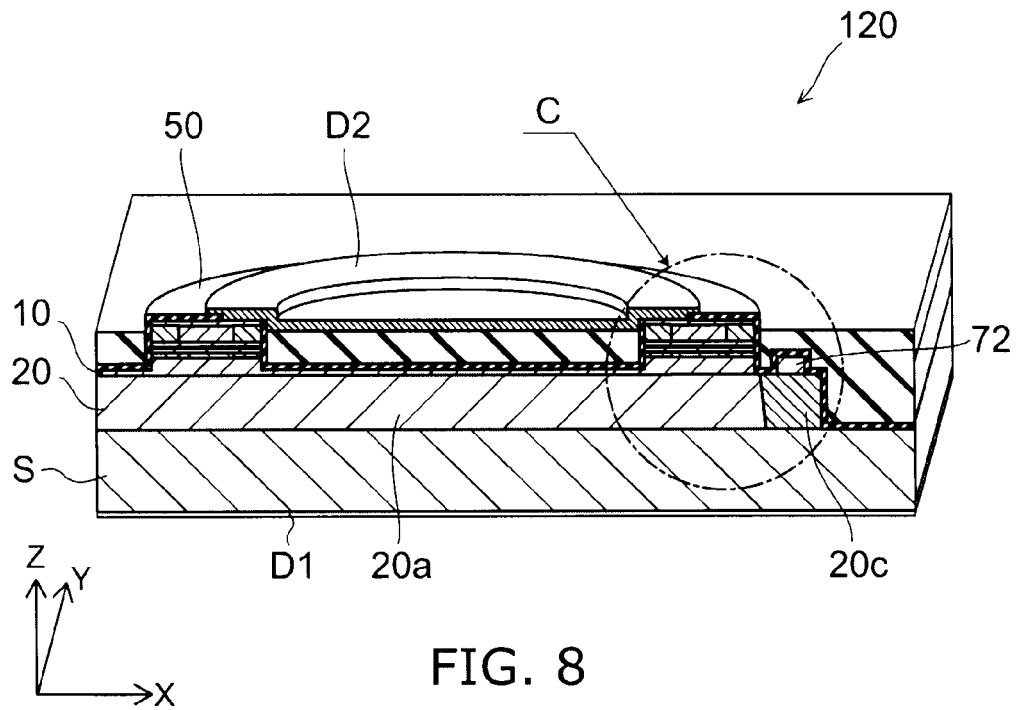
FIG. 8 is a partial sectional schematic perspective view of a semiconductor light emitting device according to an embodiment.

FIG. 8 is a partial sectional schematic perspective view of a semiconductor light emitting device according to a third embodiment.

Figure 9:
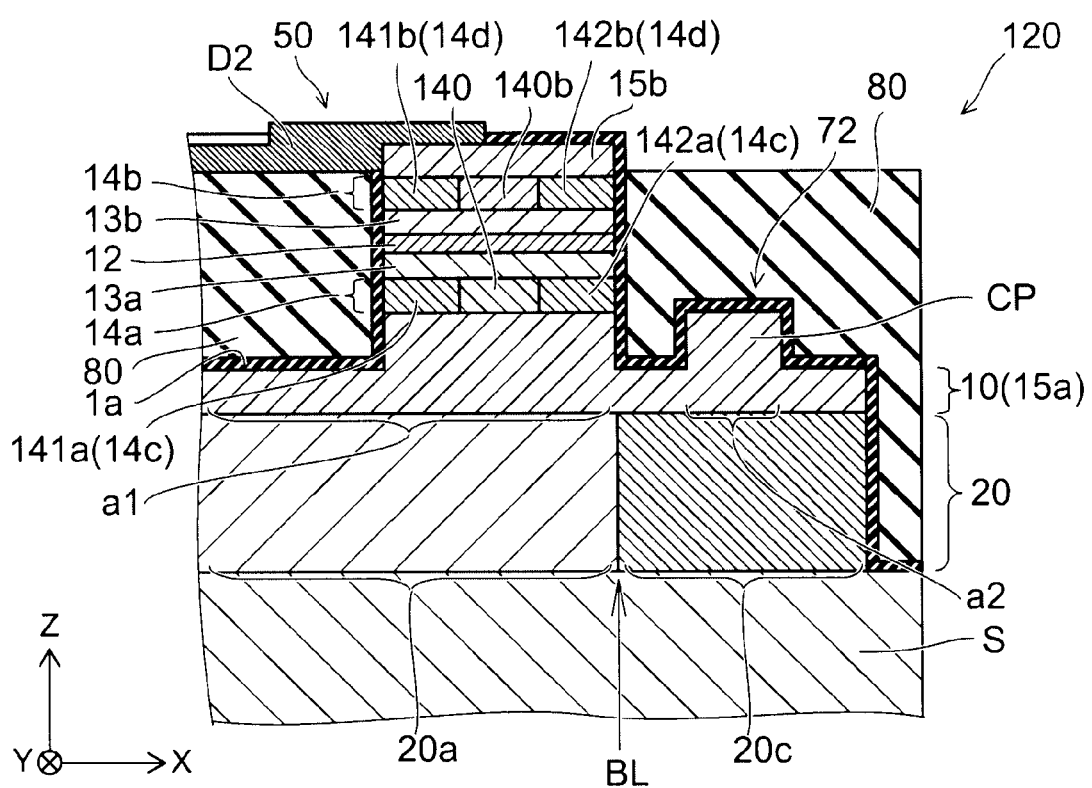
FIG. 9 is a schematic sectional view of the semiconductor light emitting device according to the embodiment.

FIG. 9 is a schematic sectional view enlarging part of the semiconductor light emitting device according to the third embodiment.

In FIG. 9, the portion C shown in FIG. 8 is shown in an enlarged view.

The semiconductor light emitting device 120 according to the third embodiment is different from the semiconductor light emitting device 110 according to the first embodiment in the structure of the optical waveguide.

More specifically, in the semiconductor light emitting device 120, the optical waveguide 72 uses the convex portion CP of the first contact layer 15a (first semiconductor layer 10) as a core.

The stacked structure (second stacked structure) of the optical waveguide 72 based on the convex portion CP is the same stacked structure as part of the stacked structure (first stacked structure) of the laser resonator 50. In the example shown in FIG. 9, in the stacked structure of the laser resonator 50, the first contact layer 15a is used to constitute the convex portion CP. That is, the first cladding layer 14a, the first optical confinement layer 13a, the active layer 12, the second optical confinement layer 13b, the second cladding layer 14b, and the second contact layer 15b included in the structure of the optical waveguide 70 of the semiconductor light emitting device 110 are not provided on the convex portion CP of the first contact layer 15a.

Such a structure of the optical waveguide 72 eliminates optical absorption in the active layer 12. This can reduce the guiding loss of light in the convex portion CP serving as a core of the optical waveguide 72. Thus, the optical output efficiency can be increased.

Fourth Embodiment

The fourth embodiment relates to a method for manufacturing the semiconductor light emitting device 120.

FIGS. 10A to 11B are schematic sectional views describing the method for manufacturing a semiconductor light emitting device.

Figure 10A:
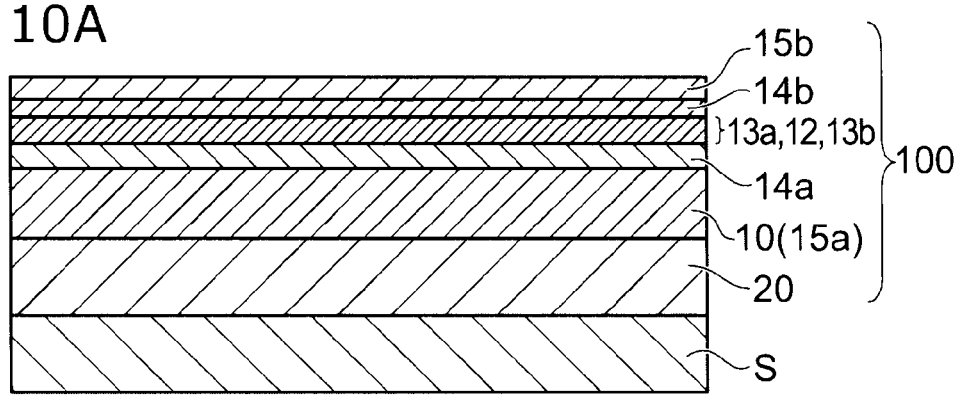
FIGS. 10A to 11B are schematic sectional views describing a method for manufacturing a semiconductor light emitting device.

First, as shown in FIG. 10A, a stacked structure 100 is formed on a substrate S. In the stacked structure 100, for instance, a lower cladding layer 20, a first contact layer 15a (first semiconductor layer 10), a first cladding layer 14a, a first optical confinement layer 13a, an active layer 12, a second optical confinement layer 13b, a second cladding layer 14b, and a second contact layer 15b are stacked. The material of each layer is similar to that of the second embodiment.

Here, the thickness of the first contact layer 15a is made thicker than the thickness of the first contact layer 15a formed in the second embodiment.

Figure 10B:
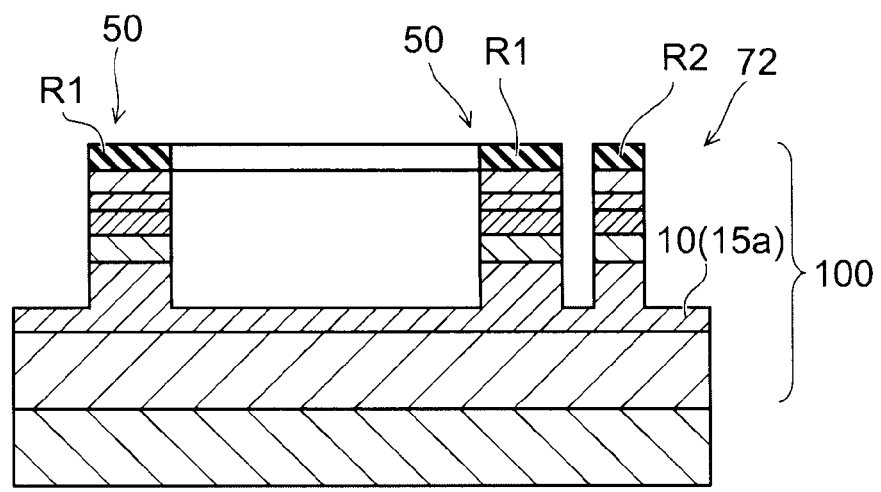

Next, as shown in FIG. 10B, on the stacked structure 100, a first resist film R1 corresponding to the ring shape of the laser resonator 50 and a second resist film R2 corresponding to the shape of the optical waveguide 72 are formed. These first resist film R1 and second resist film R2 are used as a mask to etch the stacked structure 100. This etching removes the portion of the stacked structure 100 not covered with the first resist film R1 and the second resist film R2 until the portion from the second contact layer 15b to the first contact layer 15a are exposed. Subsequently, the first resist film R1 and the second resist film R2 are removed.

Figure 10C:
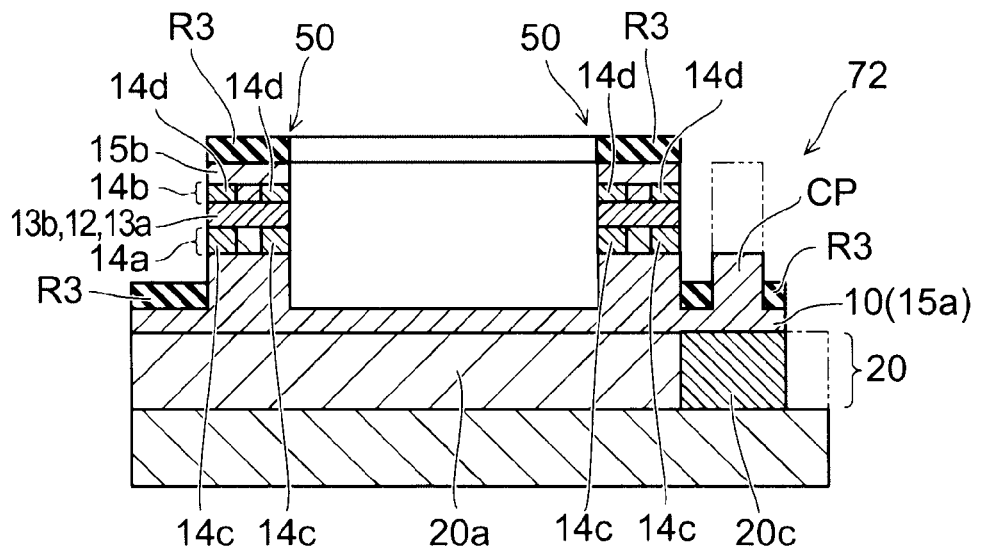

Next, as shown in FIG. 10C, a third resist film R3 is formed on the portion except the top of the optical waveguide 72 and the end portion of the lower cladding layer 20. Then, the third resist film R3 is used as a mask to perform etching. This removes the second contact layer 15b, the second cladding layer 14b, the second optical confinement layer 13b, the active layer 12, the first optical confinement layer 13a, and the first cladding layer 14a on the optical waveguide 72. Thus, a convex portion CP is left. Furthermore, simultaneously with this etching, the end portion of the lower cladding layer 20 is removed.

Next, oxidation treatment is performed. The condition for the oxidation treatment is similar to the condition for the oxidation treatment in the second embodiment. Thus, a first modified layer 14c and a second modified layer 14d are formed. Simultaneously with this oxidation, a current narrowing structure is formed. Furthermore, by this oxidation, a low refractive index layer 20c is formed in the lower cladding layer 20.

Figure 11A:
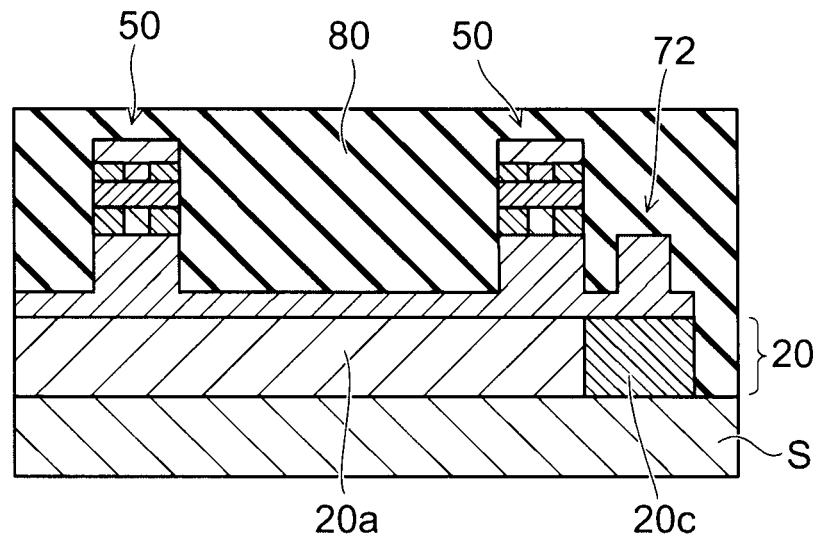
Figure 11B:
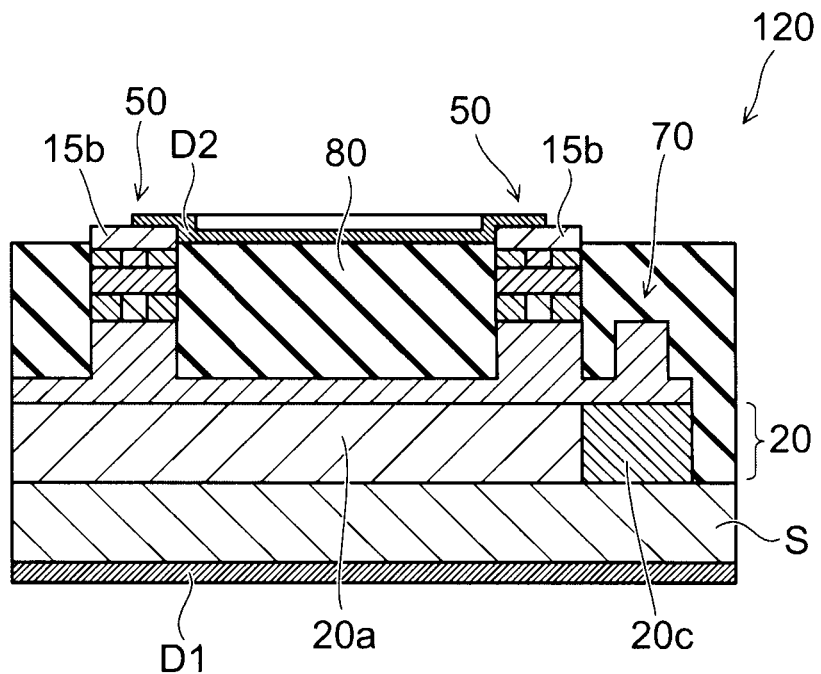

Next, as shown in FIG. 11A, an insulating film 80 burying the laser resonator 50 and the optical waveguide 72 is formed. The insulating film 80 is made of e.g. polyimide. Next, as shown in FIG. 11B, the insulating film 80 is removed by e.g. the CMP (chemical mechanical polishing) method until the second contact layer 15b is exposed. Then, a second electrode D2 is formed on the inner peripheral portion of the upper surface of the exposed second contact layer 15b and on the insulating film 80 filling the inside of the laser resonator 50. Furthermore, a first electrode D1 is formed on the back surface of the substrate S.

Thus, the semiconductor light emitting device 120 is completed.

Figure 12:
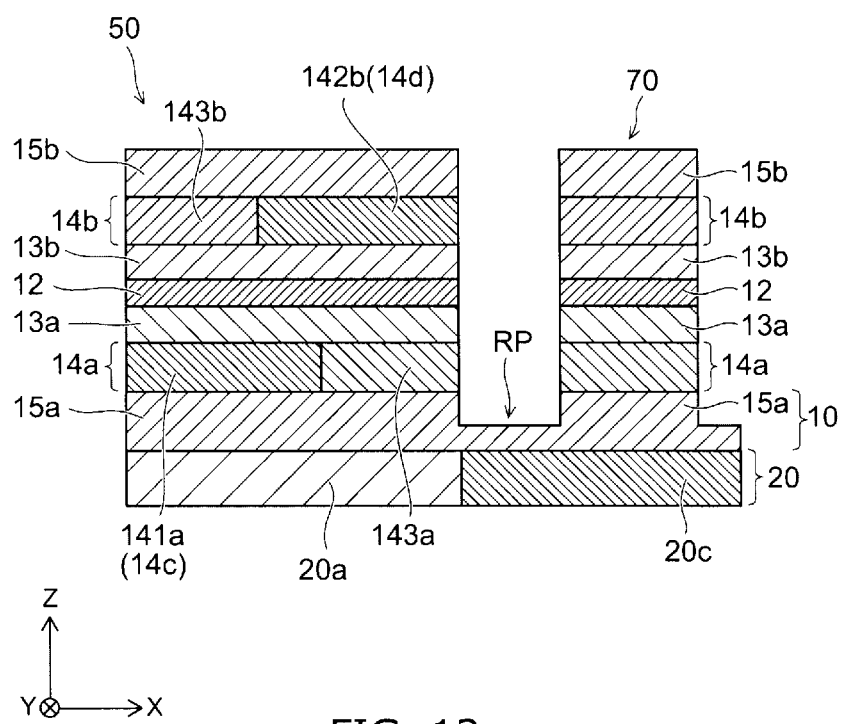
FIG. 12 is a schematic sectional view illustrating alternative modified layers.

FIG. 12 is a partial enlarged schematic sectional view illustrating the structure of alternative modified layers.

In the examples of the semiconductor light emitting devices 110 and 120 described above, the first modified layer 14c and the second modified layer 14d are provided on the outer peripheral side and inner peripheral side of the ring of the first cladding layer 14a and the second cladding layer 14b, respectively. However, it is also possible to use a structure of modified layers as shown in FIG. 12.

In this structure, the first cladding layer 14a includes a first inner peripheral portion 141a extending from the inner edge to part of the interior of the ring shape. The first inner peripheral portion 141a is modified into a modified layer 14c by the thermal oxidation method. The refractive index of the modified layer 14c is lower than the refractive index of the portion 143a except the first inner peripheral portion 141a. Hence, in the first cladding layer 14a, the portion 143a except the first inner peripheral portion 141a functions as a first cladding layer as intended.

On the other hand, the second cladding layer 14b includes a second outer peripheral portion 142b extending from the outer edge to part of the interior of the ring shape. The second outer peripheral portion 142b is modified into a modified layer 14d by the thermal oxidation method. The refractive index of the modified layer 14d is lower than the refractive index of the portion 143b except the second outer peripheral portion 142b. The modified layer 14c and the modified layer 14d have electrical insulation property. Hence, in the second cladding layer 14b, the portion 143b except the second outer peripheral portion 142b functions as a second cladding layer as intended.

Furthermore, the first modified layer 14c and the second modified layer 14d are provided so as to partly overlap each other as viewed in the Z-axis direction. This forms a current narrowing structure in which the current flows into the active layer 12 from the inner peripheral side, laterally flows along the active layer 12, and flows out from the outer peripheral side. By the lateral injection method for allowing the current to flow laterally along the active layer 12, light can also be strongly confined in the central portion.

Although FIG. 12 shows an example of using the optical waveguide 70, it is also possible to use the optical waveguide 72.

Fifth Embodiment

Figure 13A:
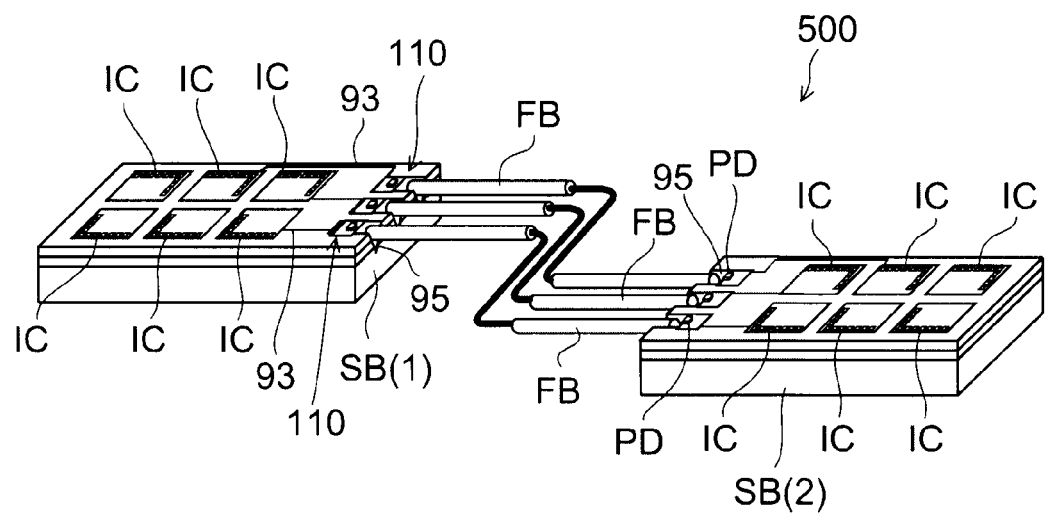
FIGS. 13A and 13B are schematic views illustrating a semiconductor light emitting apparatus according to an embodiment.
Figure 13B:
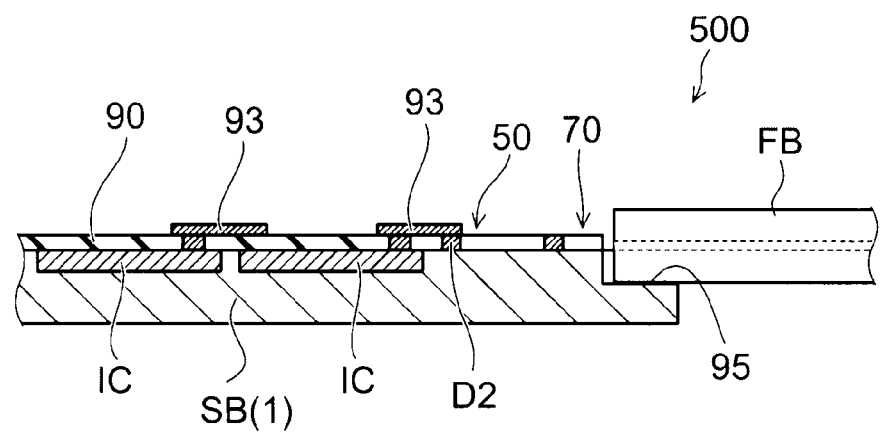

FIGS. 13A and 13B are schematic views illustrating a semiconductor light emitting apparatus according to a fifth embodiment.

FIG. 13A shows a system configuration example. FIG. 13B is a schematic sectional view enlarging the connecting portion of optical fibers.

Figure 14:
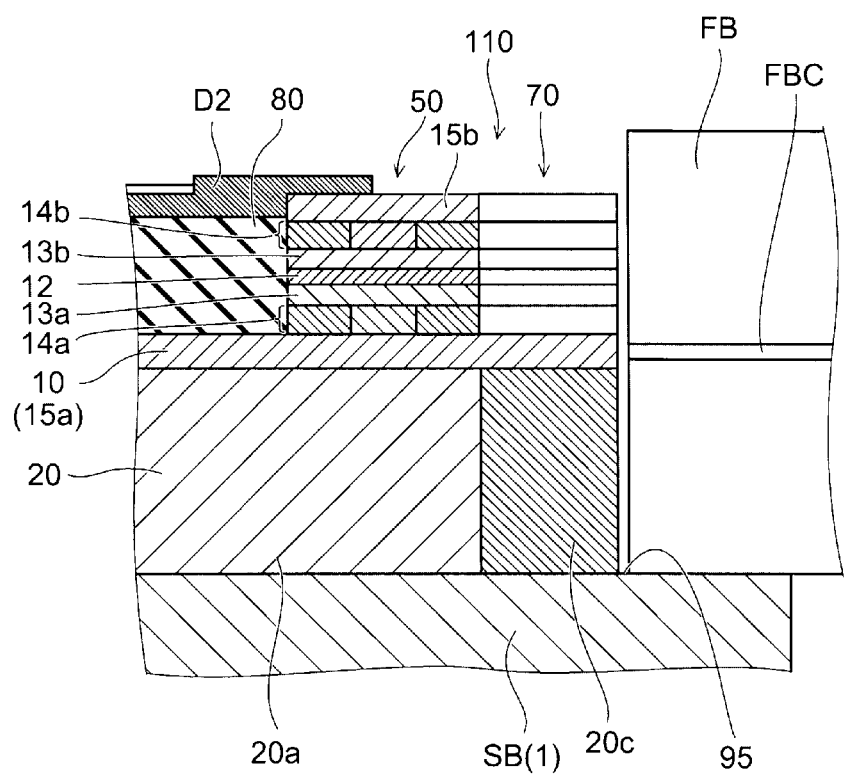
FIG. 14 is a schematic sectional view of the semiconductor light emitting apparatus according to the embodiment.

FIG. 14 is a partial enlarged schematic sectional view of the semiconductor light emitting apparatus according to the fifth embodiment.

The semiconductor light emitting apparatus 500 according to the embodiment includes an integrated circuit IC formed on a semiconductor substrate SB, the semiconductor light emitting device 110 provided on the semiconductor substrate SB, and an optical fiber FB connected to the optical waveguide 70. In the system configuration example illustrated in FIG. 13A, two semiconductor substrates SB(1) and SB(2) each with the integrated circuits IC formed thereon are connected by optical fibers FB.

On the semiconductor substrate SB(1), the aforementioned semiconductor light emitting device 110 is mounted. The second electrode D2, for instance, of the semiconductor light emitting device 110 is connected to an output signal line of the integrated circuit IC by an interconnect pattern 93. Here, besides the connection based on the interconnect pattern 93, the connection may be based on a bonding wire.

In the end portion of the semiconductor substrate SB(1), a V-shaped groove 95, for instance, is formed. One end of the optical fiber FB is attached to this groove 95. By the depth of the groove 95, the core FBC of the optical fiber FB is aligned with the first contact layer 15a corresponding to the core of the optical waveguide 70.

On the other hand, on the semiconductor substrate SB(2), a photoelectric conversion device PD is mounted. Also in the semiconductor substrate SB(2), a V-shaped groove 95, for instance, is formed. The other end of the optical fiber FB is attached to this groove 95. By the depth of the groove 95, the core FBC of the optical fiber FB is aligned with the light receiving portion of the photoelectric conversion device PD.

In the system illustrated in FIG. 13, as an example, three semiconductor light emitting devices 110 are mounted on the semiconductor substrate SB(1), and three photoelectric conversion devices PD are mounted on the semiconductor substrate SB(2). An optical fiber FB is connected between each pair of the semiconductor light emitting device 110 and the photoelectric conversion device PD.

In such a system, the output signal of the integrated circuit IC is applied to the second electrode D2 through the interconnect pattern 93. Thus, in response to the output signal of the integrated circuit IC, light is emitted from the laser resonator 50. Then, the emitted light is guided to the optical waveguide 70 and sent from the optical waveguide 70 through the optical fiber FB to the semiconductor substrate SB(2) side. On the semiconductor substrate SB(2), the optical signal received through the optical fiber FB is converted to an electrical signal by the photoelectric conversion device PD. The electrical signal is sent to the integrated circuit IC.

By such a system, signal transmission between the integrated circuit IC formed on the semiconductor substrate SB(1) and the integrated circuit IC formed on the semiconductor substrate SB(2) can be performed by optical signals.

In the example described above, a signal is sent from the semiconductor substrate SB(1) toward the semiconductor substrate SB(2). However, the opposite direction is also possible. More specifically, the semiconductor light emitting device 110 is mounted on the sending side of the signal. The photoelectric conversion device PD is mounted on the receiving side of the signal. These are connected by an optical fiber FB. Furthermore, the semiconductor light emitting device 110 and the photoelectric conversion device PD may be mounted on each of the semiconductor substrates SB(1) and SB(2) to perform bidirectional transmission and reception of signals.

In the example described in the above configuration, the semiconductor light emitting device 110 is mounted on the semiconductor substrate SB(1). However, using a substrate S as the semiconductor substrate SB(1), the stacked structure 100 of the semiconductor light emitting device 110 may be formed by continuous film formation on the semiconductor substrate SB(1). Thus, the stacked structure 100 may be formed integrally with the semiconductor substrate SB(1). Furthermore, the integrated circuit IC and the semiconductor light emitting device 110 may be integrally formed on the semiconductor substrate SB(1).

The above example of the semiconductor light emitting apparatus 500 uses the semiconductor light emitting device 110. However, the semiconductor light emitting device 120 may also be used instead of the semiconductor light emitting device 110.

As described above, the embodiments can provide a semiconductor light emitting device, a semiconductor light emitting apparatus, and a method for manufacturing a semiconductor light emitting device capable of increasing the transmission efficiency of optical signals.

The embodiments and the variations thereof have been described above. However, the invention is not limited to these examples. For instance, those skilled in the art can modify the above embodiments and the variations thereof by suitable addition, deletion, and design change of components, and by suitable combination of the features of the embodiments. Such modifications are also encompassed within the scope of the invention as long as they fall within the spirit of the invention.

For instance, in the above description of the embodiments and variations, it is assumed that the first conductivity type is n-type and the second conductivity type is p-type. However, the invention is also practicable when the first conductivity type is p-type and the second conductivity type is n-type.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
a first semiconductor layer including a first portion and a second portion juxtaposed with the first portion;
a second semiconductor layer being in contact with a lower surface of the first portion;
a laser resonator provided on the first portion and having a ring-shaped resonator structure circled along a major surface of the first semiconductor layer, the laser resonator configured to emit light; and
a low refractive index layer provided in contact with a lower surface of the second portion,
the second portion being configured to guide the light,
the first portion having a first refractive index with respect to the light,
the second portion having a second refractive index with respect to the light,
the second semiconductor layer having a third refractive index with respect to the light,
the low refractive index layer having a fourth refractive index with respect to the light,
the fourth refractive index being lower than the second refractive index,
an absolute value between the second refractive index and the fourth refractive index being larger than an absolute value of a difference between the first refractive index and the third refractive index,
a conductivity of the low refractive index layer being lower than a conductivity of the second semiconductor layer,
as viewed in a direction orthogonal to the major surface, a boundary between the low refractive index layer and the second semiconductor layer being located at a first position immediately below a ring outer periphery position of the laser resonator or being located at a second position shifted from the first position to inside of the ring.

2. The device according to claim 1, wherein the first semiconductor layer, the second semiconductor layer, and the laser resonator include a compound semiconductor.

3. The device according to claim 1, further comprising,
the laser resonator including a first stacked structure including a first part of a first layer to form a first cladding layer, a first part of a second layer to form an active layer, and a first part of a third layer to form a second cladding layer, and
a second stacked structure provided on the second portion and including at least one of a second part of the first layer, a second part of the second layer and a second part of the third layer.

4. The device according to claim 1, wherein the first semiconductor layer includes a recessed portion provided between the first portion and the second portion.

5. The device according to claim 3, wherein a layer structure of the second stacked structure is same as a layer structure of the first stacked structure.

6. The device according to claim 3, wherein a layer structure of the second stacked structure is identical to a part of a layer structure of the first stacked structure.

7. The device according to claim 3, wherein
the first cladding layer includes:
- a first outer peripheral portion extending from a ring outer edge to a part of interior of the first cladding layer;
- a first inner peripheral portion extending from a ring inner edge to a part of interior of the first cladding layer; and
- a first central portion between the first outer peripheral portion and the first inner peripheral portion of the first cladding layer, refractive index for the light of the first outer peripheral portion and the first inner peripheral portion is lower than refractive index for the light of the first central portion, the second cladding layer includes:
- a second outer peripheral portion extending from a ring outer edge to a part of interior of the second cladding layer;
- a second inner peripheral portion extending from a ring inner edge to a part of interior of the second cladding layer; and
- a second central portion between the second outer peripheral portion and the second inner peripheral portion of the second cladding layer, and refractive index for the light of the second outer peripheral portion and the second inner peripheral portion is lower than refractive index for the light of the second central portion.

8. The device according to claim 7, wherein
the first outer peripheral portion includes a portion formed by thermally oxidizing the first cladding layer,
the first inner peripheral portion includes a portion formed by thermally oxidizing the first cladding layer,
the second outer peripheral portion includes a portion formed by thermally oxidizing the second cladding layer, and
the second inner peripheral portion includes a portion formed by thermally oxidizing the second cladding layer.

9. The device according to claim 7, wherein the first outer peripheral portion, the first inner peripheral portion, the second outer peripheral portion, and the second inner peripheral portion have electrical insulation property.

10. The device according to claim 3, wherein
the first cladding layer includes a first inner peripheral portion extending from a ring inner edge to a part of interior of the first cladding layer,
refractive index for the light of the first inner peripheral portion is lower than refractive index for the light of a portion except the first inner peripheral portion,
the second cladding layer includes a second outer peripheral portion extending from a ring outer edge to a part of interior of the second cladding layer, and
refractive index for the light of the second outer peripheral portion is lower than refractive index for the light of a portion except the second outer peripheral portion.

11. The device according to claim 10, wherein
the first inner peripheral portion includes a portion formed by thermally oxidizing the first cladding layer, and
the second outer peripheral portion includes a portion formed by thermally oxidizing the second cladding layer.

12. The device according to claim 10, wherein the first inner peripheral portion and the second outer peripheral portion have electrical insulation property.

* * * * *

UNITED STATES PATENT AND TRADEMARK OFFICE
CERTIFICATE OF CORRECTION

| | | |
|---|---|---|
| PATENT NO. | : 8,885,685 B2 | Page 1 of 1 |
| APPLICATION NO. | : 13/247072 | |
| DATED | : November 11, 2014 | |
| INVENTOR(S) | : Kazuya Ohira et al. | |

It is certified that error appears in the above-identified patent and that said Letters Patent is hereby corrected as shown below:

On the Title page, Item (54) and in the Specification, column 1, line 1, the Title is incorrect. Item (54) and column 1, line 1, should read:

-- SEMICONDUCTOR LIGHT EMITTING DEVICE, SEMICONDUCTOR LIGHT EMITTING APPARATUS, AND METHOD FOR MANUFACTURING SEMICONDUCTOR LIGHT EMITTING DEVICE --

Signed and Sealed this
Fourteenth Day of April, 2015

Michelle K. Lee
*Director of the United States Patent and Trademark Office*